United States Patent
Moon et al.

(10) Patent No.: US 9,564,611 B2
(45) Date of Patent: Feb. 7, 2017

(54) ORGANIC LIGHT EMITTING DISPLAY DEVICE

(71) Applicant: Samsung Display Co., Ltd., Yongin (KR)

(72) Inventors: Jung-Woo Moon, Suwon-si (KR); Joon-Youp Kim, Seoul (KR); Kyung-Ho Kim, Seoul (KR); Jin-Koo Chung, Suwon-si (KR); Jun-Ho Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 81 days.

(21) Appl. No.: 14/662,875

(22) Filed: Mar. 19, 2015

(65) Prior Publication Data

US 2016/0064692 A1 Mar. 3, 2016

(51) Int. Cl.
*H01L 51/52* (2006.01)
*H01L 27/32* (2006.01)

(52) U.S. Cl.
CPC ......... *H01L 51/5262* (2013.01); *H01L 27/326* (2013.01); *H01L 51/525* (2013.01); *H01L 27/3246* (2013.01)

(58) Field of Classification Search
CPC .......... H01L 51/50; H01L 51/00; H01L 27/32; H01L 51/52; H01L 51/5262; H01L 27/326; H01L 51/525; H01L 27/3246; H01L 51/5012; H01L 51/0096; H01L 51/5284

USPC .......................................................... 257/40
See application file for complete search history.

(56) References Cited

U.S. PATENT DOCUMENTS

| | | |
|---|---|---|
| 2010/0237374 A1 | 9/2010 | Chu et al. |
| 2011/0220899 A1 | 9/2011 | Park et al. |
| 2011/0249211 A1 | 10/2011 | Song et al. |
| 2012/0001184 A1* | 1/2012 | Ha ..................... H01L 51/5228 257/59 |
| 2013/0187131 A1 | 7/2013 | Chung et al. |

FOREIGN PATENT DOCUMENTS

| | | |
|---|---|---|
| KR | 10-2010-0105431 | 9/2010 |
| KR | 10-2012-0052206 | 5/2012 |
| KR | 10-2012-0052914 | 5/2012 |
| KR | 10-1221467 | 1/2013 |
| KR | 10-1275810 | 6/2013 |
| KR | 10-2013-0131693 | 12/2013 |

* cited by examiner

*Primary Examiner* — Selim Ahmed
(74) *Attorney, Agent, or Firm* — H.C. Park & Associates, PLC

(57) ABSTRACT

An organic light emitting display device includes a first substrate, a light emitting structure, a light transmitting member, and a second substrate. The first substrate includes a pixel region and a transparent region. The light emitting structure is positioned in the pixel region of the first substrate. The light transmitting member is positioned in the transparent region. The second substrate is disposed on the light emitting structure and the light transmitting member. The light is not refracted in interfaces between the light transmitting member and the first substrate and between the light transmitting member and the second substrate.

20 Claims, 9 Drawing Sheets

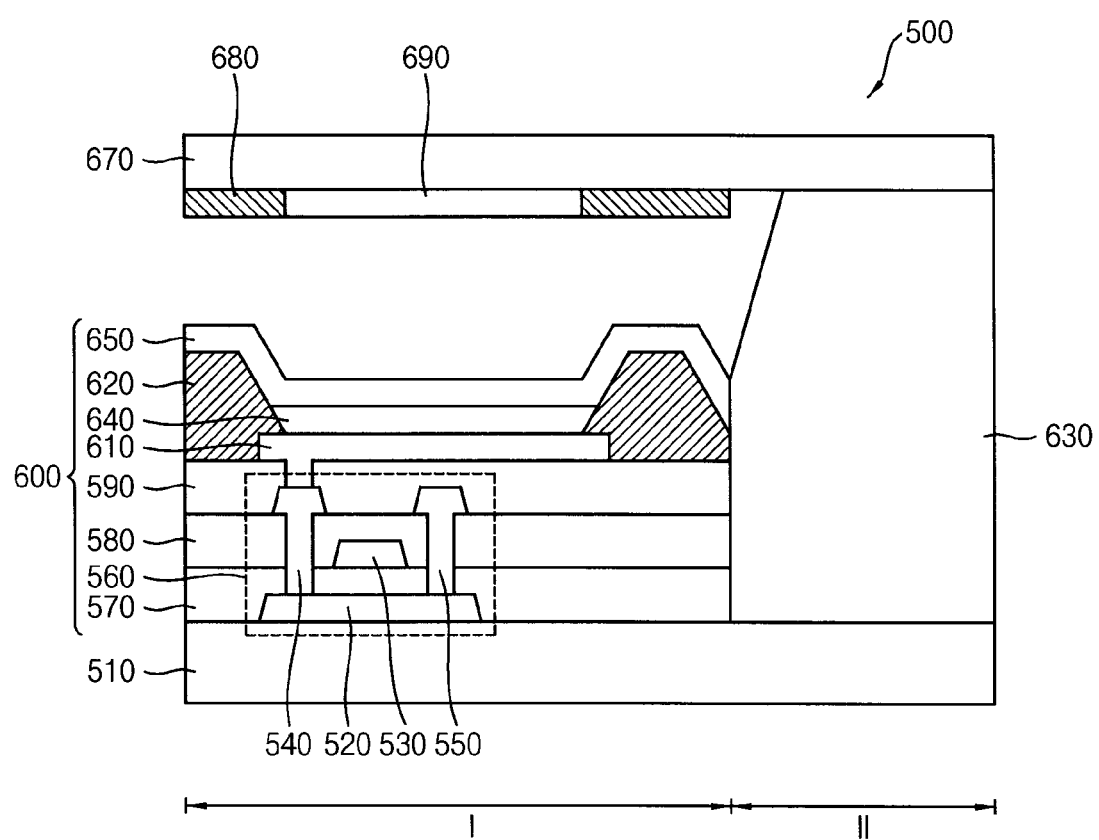

ORGANIC LIGHT EMITTING DISPLAY DEVICE

CROSS REFERENCE TO RELATED APPLICATION

This application claims priority from and the benefit of Korean Patent Application No. 10-2014-0115101 filed on Sep. 1, 2014, which is hereby incorporated by reference for all purposes as if fully set forth herein.

BACKGROUND

Field

Exemplary embodiments of the present invention relate to organic light emitting display devices. More particularly, exemplary embodiments of the present invention relate to organic light emitting display devices including light transmitting members.

Discussion of the Background

A flat panel display (FPD) device is widely used as a display device in an electronic device because the FPD device is lightweight and thin compared to a cathode-ray tube (CRT) display device. Typical examples of the FPD device are a liquid crystal display (LCD) device and an organic light emitting display (OLED) device. Compared to the LCD device, the organic light emitting display device has many advantages, such as a higher luminance and a wider viewing angle. In addition, the organic light emitting display device may be thinner than the LCD device because the organic light emitting display device may not include a backlight. In the organic light emitting display device, electrons and holes are injected into an organic thin layer through a cathode and an anode, and are then recombined in the organic thin layer to generate excitons, thereby emitting a light of a certain wavelength.

Recently, a transparent organic light emitting display device transmitting an image of an object (or target) that is located in the rear (or at the back) of the organic light emitting display device by including a transparent region and a display region has been developed. In this case, a transmissivity of the transparent organic light emitting display may be determined according to structures (e.g., a lower substrate, an insulating layer, an upper substrate, a space including nitrogen between the lower substrate and the upper substrate) positioned on the transparent region. When the transmissivity is high, a definition of the image of an object that is located behind the organic light emitting display device may be increased. However, in a conventional transparent organic light emitting display device, it is difficult to increase the definition because each of structures positioned on the transparent region have different refractive indexes.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments of the present invention provide organic light emitting display devices including a light transmitting member in a transparent region.

Additional aspects will be set forth in the detailed description which follows, and, in part, will be apparent from the disclosure, or may be learned by practice of the inventive concept.

An exemplary embodiment of the present invention discloses an organic light emitting display device including a first substrate, a light emitting structure, a light transmitting member, and a second substrate. The first substrate includes a pixel region and a transparent region. The light emitting structure is positioned in the pixel region of the first substrate. The light transmitting member is positioned in the transparent region. The second substrate is disposed on the light emitting structure and the light transmitting member. The light is not refracted in interfaces between the light transmitting member and the first substrate and between the light transmitting member and the second substrate.

According to exemplary embodiments, since the organic light emitting display device includes a light transmitting member, transmissivity of the transparent region may be increased.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

FIG. 5 is a cross-sectional view illustrating an organic light emitting display device in accordance with exemplary embodiments of the present invention.

DETAILED DESCRIPTION OF THE ILLUSTRATED EMBODIMENTS

Figure 1:
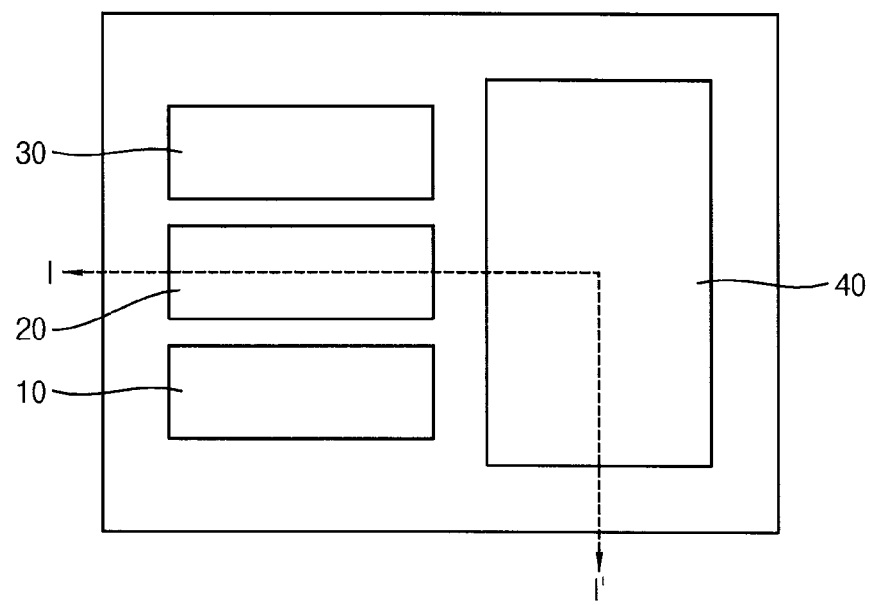
FIG. 1 is a plan view illustrating a comparative example of an organic light emitting display device.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a plan view illustrating a comparative example of an organic light emitting display device.

Referring to FIG. 1, an organic light emitting display device may include a pixel region and a transparent region. A plurality of pixels 10, 20, and 30 may be positioned in the pixel region, and a transparent window 40 may be positioned in the transparent region. The pixel 10 may be a pixel emitting a red color, the pixel 20 may be a pixel emitting a green color, and the pixel 30 may be a pixel emitting a blue color. The transparent window 40 may transmit external light. Here, wires or lines (data electrodes, scan electrodes, power supply electrodes, etc.) and insulating layers (a pixel defining layer, a protection layer, etc.) may be disposed in an area surrounding the pixels 10, 20, and 30, and the transparent window 40.

Figure 2:
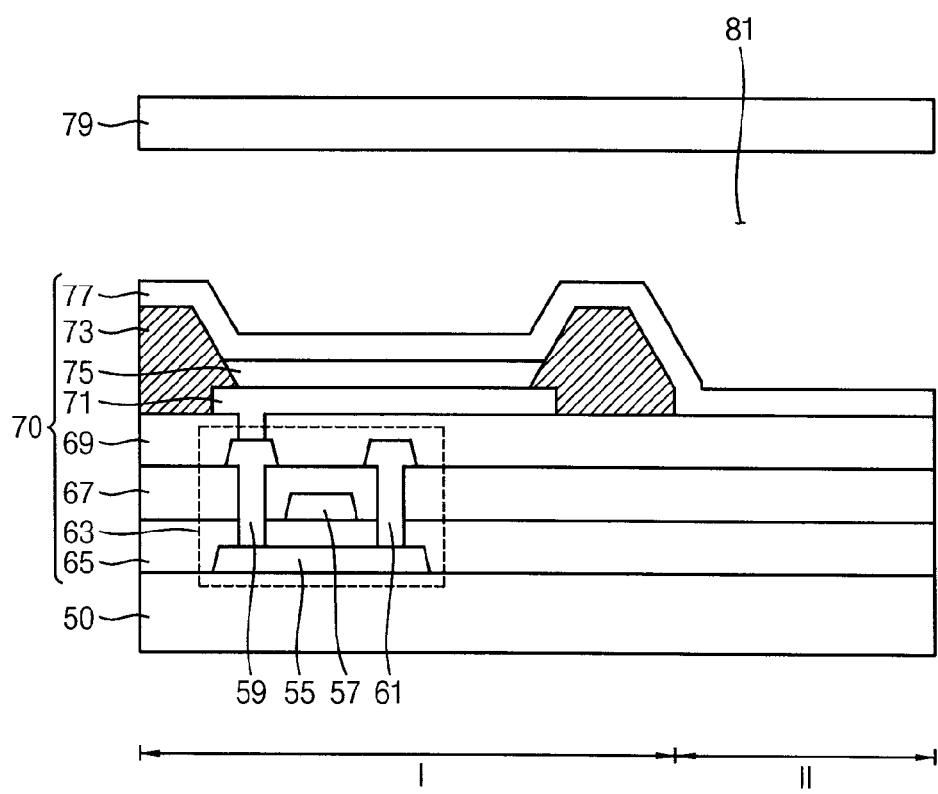
FIG. 2 is a cross-sectional view illustrating a comparative example of an organic light emitting display device, taken along a line I-I' of FIG. 1.

FIG. 2 is a cross-sectional view illustrating a comparative example of an organic light emitting display device, taken along a line I-I' of FIG. 1.

Referring to FIG. 2, an organic light emitting display device may include a first substrate 50, a light emitting structure 70, a second substrate 79, etc. In addition, the conventional organic light emitting display device may include a pixel region I and a transparent region II. Here, the transparent region II may be the above-described transparent window 40. The light emitting structure 70 may be positioned in the pixel region I. The light emitting structure 70 may include a driving transistor, a first insulating layer 65, a gate insulating layer 67, a second insulating layer 69, an anode electrode 71, a pixel defining layer 73, an emission layer 75, and a cathode electrode 77. Here, the driving transistor may include an active layer 55, a gate electrode 57, a source electrode 59, and a drain electrode 61. In this case, the first insulating layer 65, the gate insulating layer 67, the second insulating layer 69, and the cathode electrode 77 may extend from the pixel region I into the transparent region II. That is, the first substrate 50, the first insulating layer 65, the gate insulating layer 67, the second insulating layer 69, the cathode electrode 77 and the second substrate 79 may be disposed in the transparent region II. In addition, a space including nitrogen 81 may be provided in the transparent region II. Here, since an encapsulation process (e.g., a process combining the first substrate 65 and the second substrate 79) is performed in a chamber of the nitrogen atmosphere, the space 81 between the cathode electrode 77 and the second substrate 79 may include the nitrogen.

The structures positioned in the transparent region II may have different refractive indexes. In this case, when an external light (or lights) transmits through the transparent region II, the external light may be refracted, and transmissivity of the comparative example of an organic light emitting display device may be decreased. To decrease the refraction of the light, the first insulating layer 65, the gate insulating layer 67, the second insulating layer 69, and the cathode electrode 77 may be removed from the first substrate 50. In this case, while refractive index of the first substrate 50 may be substantially the same as that of the second substrate 79, the refractive index of the first and second substrates 50 and 79 may be different from that of the space 81. Thus, the transmissivity of the comparative example of an organic light emitting display device may be still decreased.

Figure 3:
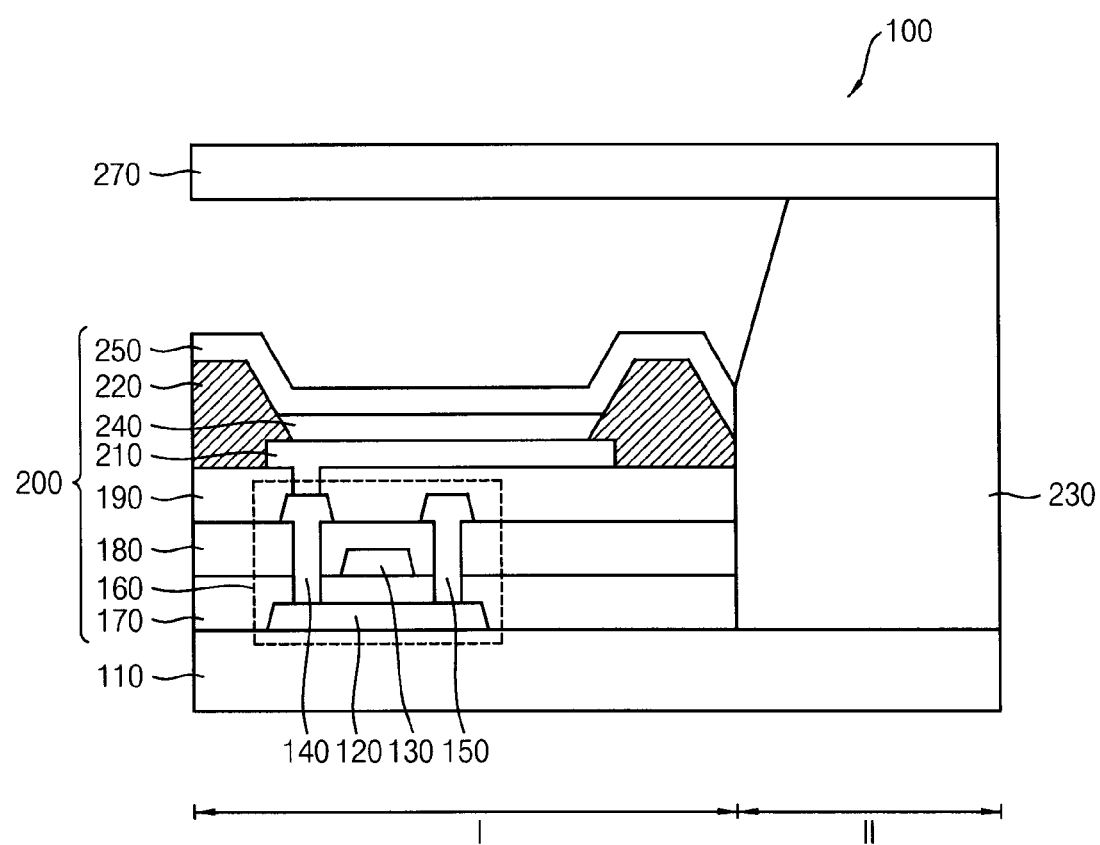
FIG. 3 is a cross-sectional view illustrating an organic light emitting display device in accordance with exemplary embodiments of the present invention.

FIG. 3 is a cross-sectional view illustrating an organic light emitting display device in accordance with an exemplary embodiment of the present invention.

Referring to FIG. 3, an organic light emitting display device 100 may include a first substrate 110, a light emitting structure 200, a light transmitting member 230, a second substrate 270, etc. In exemplary embodiments, the organic light emitting display device 100 may include a pixel region I and a transparent region II. The light emitting structure 200 may be positioned in the pixel region I. The light transmitting member 230 may be positioned in the transparent region II. For example, an image may be displayed in the pixel region I. An image of an object that is located behind the organic light emitting display device 100 may be transmitted through the transparent region II. Accordingly, the organic light emitting display device 100 may serve as a transparent display device including the transparent region II.

The first substrate 110 may include transparent materials. For example, the first substrate 110 may include a glass substrate, a quartz substrate, a synthetic quartz substrate, a calcium fluoride ($CaF_2$) substrate, a fluoride-doping quartz substrate, a sodalime substrate, non-alkali substrate etc. In exemplary embodiments, the first substrate 110 may include the non-alkali substrate, and the refractive index of the first substrate 110 may be about 1.5. The first substrate 110 may include a substrate including transparent materials that have a refractive index in a range between about 1.4 and about 1.6. That is, the refractive index of the light transmitting member 230 and the second substrate 270 may be substantially the same as that of the first substrate 110. The organic light emitting display device 100 includes the pixel region I and the transparent region II, and the first substrate 110 may include the pixel region I and the transparent region II. Here, the transparent region II may be a transparent window.

The light emitting structure 200 may be disposed in the pixel region I of the first substrate 110. Here, the light emitting structure 200 may include a driving transistor 160, a first insulating layer 170, a gate insulating layer 180, a second insulating layer 190, a first electrode 210, a pixel defining layer 220, an emission layer 240, a second electrode 250, etc.

The driving transistor 160 may include an active layer 120, a gate electrode 130, a source electrode 140, and a drain electrode 150. The active layer 120 may be disposed on the first substrate 110. The active layer 120 may include an oxide semiconductor, an inorganic semiconductor (amorphous silicon, polysilicon, etc.), an organic semiconductor, etc. The first insulating layer 170 may be disposed on the active layer 120. The first insulating layer 170 may cover the active layer 120, and may extend into the pixel region I. That is, the first insulating layer 170 may be entirely disposed in the pixel region I of the first substrate 110, and may not be disposed in the transparent region II of the first substrate 110. The first insulating layer 170 may include a silicon compound, a metal oxide, etc. The gate electrode 130 may be disposed on the first insulating layer 170 under which the active layer 120 is positioned. The gate electrode 130 may include metal, alloy, metal nitride, conductive metal oxide, transparent conductive materials, etc. The gate insulating layer 180 may be disposed on the gate electrode 130. The gate insulating layer 180 may cover the gate electrode 130, and may extend into the pixel region I. That is, the gate insulating layer 180 may be entirely disposed in the pixel region I of the first substrate 110, and may not be disposed in the transparent region II of the first substrate 110. The gate insulating layer 180 may include a silicon compound, a metal oxide, etc. The source electrode 140 and the drain electrode 150 may be disposed on the gate insulating layer 180. The source electrode 140 may be disposed in a first side of the active layer 120 by removing a first portion of the first and gate insulating layers 170 and 180. The drain electrode 150 may be disposed in a second side of the active layer 120 by removing a second portion of the first and gate insulating layers 170 and 180. Each of the source electrode 140 and the drain electrode 150 may include metal, alloy, metal nitride, conductive metal oxide, transparent conductive materials, etc. These may be used alone or in a combination thereof. The second insulating layer 190 may be disposed on the source electrode 140 and the drain electrode 150. The second insulating layer 190 may cover the source electrode 140 and the drain electrode 150, and may extend into the pixel region I. That is, the second insulating layer 190 may be entirely disposed in the pixel region I of the first substrate 110, and may not be disposed in the transparent region II of the first substrate 110. The second insulating layer 190 may include a silicon compound, a metal oxide, etc. The first electrode 210 may be disposed on the second insulating layer 190. The first electrode 210 may contact the source electrode 140 through a removed portion of the second insulating layer 190. The first electrode 210 may include metal, alloy, metal nitride, conductive metal oxide, transparent conductive materials, etc. The pixel defining layer 220 may be disposed on a portion of the second insulating layer 190 and a portion of the first electrode 210. The pixel defining layer 220 may cover both side portions of the first electrode 210, and may expose a portion of the first electrode 210. The pixel defining layer 220 may include organic materials or inorganic materials. The emission layer 240 may be disposed on the first electrode 210. The emission layer 240 may be formed using light emitting materials capable of generating different colors of light (e.g., a red color of light, a blue color of light, and a green color of light). The emission layer 240 may generally generate a white color of light by stacking light emitting materials capable of generating different colors of light. The second electrode 250 may be disposed on the pixel defining layer 220 and the emission layer 240. The second electrode 250 may cover the pixel defining layer 220 and the emission layer 240, and may extend into the pixel region I. That is, the second electrode 250 may be entirely disposed in the pixel region I of the first substrate 110, and may not be disposed in the transparent region II of the first substrate 110.

The light transmitting member 230 may be disposed in the transparent region II of the first substrate 110. The light transmitting member 230 may be disposed adjacent to the light emitting structure 200 that is positioned in the pixel region I of the first substrate 110. The light transmitting member 230 may include transparent organic materials. For example, the light transmitting member 230 may include polyimide, photoresist, acryl, polyamide, siloxane, etc. These may be used alone or in a combination thereof. In exemplary embodiments, the light transmitting member 230 may include transparent siloxane, transparent acryl, and/or transparent polyimide. The refractive index of the light transmitting member 230 may be about 1.5. The light transmitting member 230 include transparent materials that have a refractive index in a range of between about 1.4 and about 1.6. That is, the refractive index of the transparent member may be substantially the same as that of the first substrate 110 and the second substrate 270. A light may be transmitted via the first substrate 110, the light transmitting member 230, and the second substrate 270 in the transparent region II. In other words, the light transmitting member 230 may include a first contact surface (or interface) that contacts the first substrate 110 and a second contact surface that contacts the second substrate 270. Since the first substrate 110 and the light transmitting member 230 have substantially the same refractive index, the light transmitted through the first substrate 110 from the outside may not be refracted in the first contact surface. That is, the light may not be refracted in an interface between the light transmitting member 230 and the first substrate 110. Since the light transmitting member 230 and the second substrate 270 have substantially the same refractive index, the light transmitted through the first contact surface may not be refracted in the second contact surface. That is, the light may not be refracted in an interface between the light transmitting member 230 and the second substrate 270. As a result, the light may transmit through the transparent region II of the organic light emitting display device 100 without refraction of the light. In addition, since insulating layers and an electrode (e.g., the first insulating layer 170, the gate insulating layer 180, the second insulating layer 190, and second electrode 250) that extend from the pixel region I are not disposed in the transparent region II, interlayer interfaces capable of reflecting light may be reduced. Accordingly, the light is not refracted in the interfaces between the light transmitting member 230 and the first substrate 110 and between the light transmitting member 230 and the second substrate 270 so transmissivity of the organic light emitting display device 100 may be increased. As such, the definition of an image of an object that is located behind the organic light emitting display device 100 may be increased.

The second substrate 270 may be disposed on the light emitting structure 200 and the light transmitting member 230. The second substrate 270 may contact the second contact surface of the light transmitting member 230. The second substrate 270 may include materials substantially the same as that of the first substrate 110. For example, the second substrate 270 may include a glass substrate, a quartz substrate, a synthetic quartz substrate, a calcium fluoride (CaF$_2$) substrate, a fluoride-doping quartz substrate, a sodalime substrate, a non-alkali substrate etc. In exemplary embodiments, the second substrate 270 may include the non-alkali substrate, and the refractive index of the second substrate 270 may be about 1.5. The second substrate 270 may include transparent materials that have a refractive index in a range of between about 1.4 and about 1.6. That is, the refractive index of the first substrate 110 and the light transmitting member 230 may be substantially the same as that of the second substrate 270.

In exemplary embodiments, the first substrate 110, light transmitting member 230, and the second substrate 270 have a refractive index that is 1.5. When at least one insulating layer is interposed between the first substrate 110 and the light transmitting member 230 in the transparent region II, the refractive index of the first substrate 110, the light transmitting member 230, and the second substrate 270 may be changed to have the same refractive index that of the at least one insulating layer. The at least one insulating layer may include organic or inorganic materials The organic material have a refractive index that is in a range of between about 1.4 and about 1.9, and the inorganic materials may have a refractive index that is in a range of between about 1.5 and about 1.9. Thus, the refractive index of the first substrate 110, the light transmitting member 230, and the second substrate 270 may have a refractive index that is in a range of between about 1.4 and about 1.6.

The organic light emitting display device 100 according to exemplary embodiments may include the first substrate 110, the light transmitting member 230, and the second substrate 270. Here, the first substrate 110, the light transmitting member 230, and second substrate 270 may have the same refractive index in the transparent region II. Accordingly, the organic light emitting display device 100 may serve as the transparent display device having increased transmissivity in the transparent region II since the light is not refracted in the transparent region II. Since the insulating layers and the second electrode 250 extended from the pixel region I are not disposed in the transparent region II, interlayer interfaces capable of reflecting light may be reduced. Further, when the light transmitting member 230 is disposed only in the transparent region II, transmissivity of the organic light emitting display device 100 may be further increased. Thus, the definition of an image of an object that is located behind the organic light emitting display device 100 may be increased.

FIGS. 4A through 4G are cross-sectional views illustrating a method of manufacturing an organic light emitting display device in accordance with exemplary embodiments.

Figure 4A:
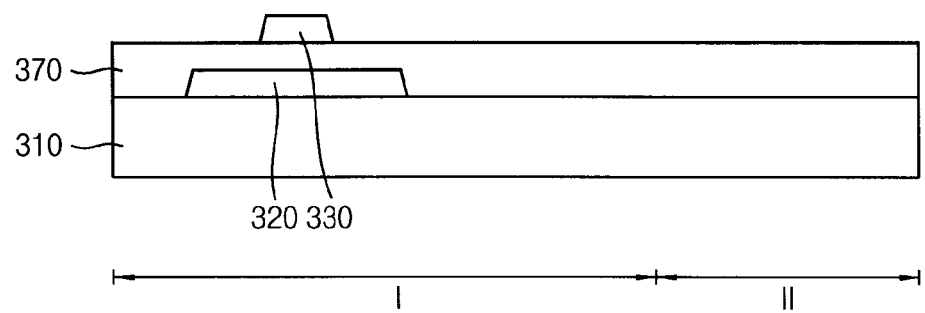
FIGS. 4A, 4B, 4C, 4D, 4E, 4F, and 4G are cross-sectional views illustrating a method of manufacturing an organic light emitting display device in accordance with exemplary embodiments of the present invention.

Referring to FIG. 4A, an active layer 320 may be formed in a pixel region I of a first substrate 310. The first substrate 310 may include transparent materials. For example, the first substrate 310 may be formed using a glass substrate, a quartz substrate, a synthetic quartz substrate, a calcium fluoride (CaF$_2$) substrate, a fluoride-doping quartz substrate, a sodalime substrate, a non-alkali substrate, etc. In exemplary embodiments, the first substrate 310 may include the non-alkali substrate, and refractive index of the first substrate 310 may be about 1.5. The first substrate 310 may include a substrate including transparent materials that have a refractive index in a range of between about 1.4 and about 1.6. The active layer 320 may be formed using an oxide semiconductor, an inorganic semiconductor, or an organic semiconductor, etc.

A first insulating layer 370 may be formed on the first substrate 310. The first insulating layer 370 may cover the active layer 320, and extend from the pixel region I into a transparent region II. For example, the first insulating layer 370 may be formed using a silicon compound, a metal oxide, etc.

A gate electrode 330 may be formed on the first insulating layer 370 under which the active layer 320 is positioned. In exemplary embodiments, the gate electrode 330 may be formed using metal, alloy, metal nitride, conductive metal oxide, transparent conductive materials, etc.

Figure 4B:
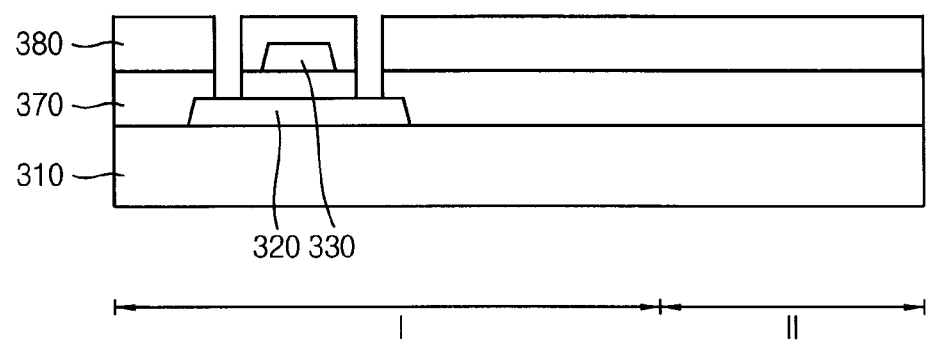

Referring to FIG. 4B, a gate insulating layer 380 may be formed on the first insulating layer 370. The gate insulating layer 380 may cover the gate electrode 330, and may extend from the pixel region I into the transparent region II. After the gate insulating layer 380 is formed on the first insulating layer 370, a first contact hole positioned in a first side of the active layer 320 may be formed by removing a first portion of the first insulating layer 370 and the gate insulating layer 380. A second contact hole positioned in a second side of the active layer 320 may be formed by removing a second portion of the first insulating layer 370 and the gate insulating layer 380. The gate insulating layer 380 may be formed using a silicon compound, a metal oxide, etc.

Figure 4C:
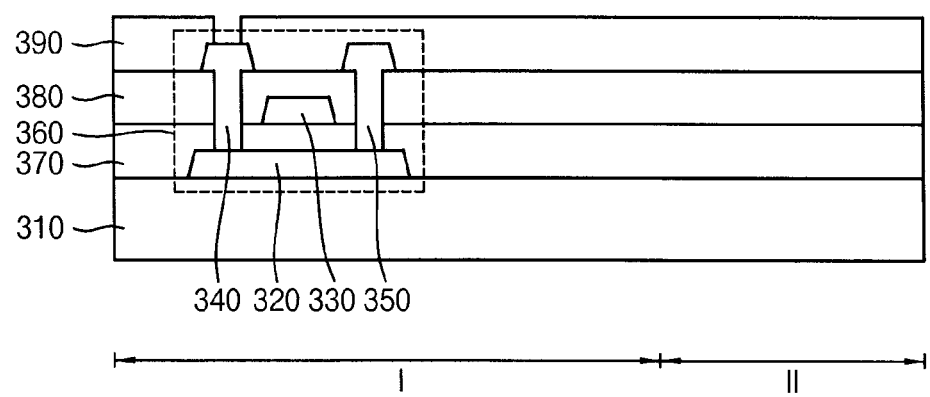

Referring to FIG. 4C, a source electrode 340 may fill the first contact hole. The source electrode 340 extends into the first contact hole, and may be formed such that the source electrode 340 contacts the first side of the active layer 320. A drain electrode 350 may fill the second contact hole. The drain electrode 350 extends into the second contact hole, and may be formed such that the drain electrode 350 contacts the second side of the active layer 320. The source electrode 340 and the drain electrode 350 may be formed using metal, alloy, metal nitride, conductive metal oxide, transparent conductive materials, etc. These may be used alone or in a combination thereof. Thus, a driving transistor 360 including the source electrode 340, the drain electrode 350, the gate electrode 330, and the active layer 320 may be formed.

A second insulating layer 390 may be formed on the source electrode 340 and the drain electrode 350. The second insulating layer 390 may cover the source electrode 340 and the drain electrode 350, and may extend from the pixel region I into the transparent region II. The second insulating layer 390 may be formed using a silicon compound, a metal oxide, etc. After the second insulating layer 390 is formed on the gate insulating layer 380, a third contact hole exposing a portion of the source electrode 340 may be formed by removing a portion of the second insulating layer 390.

Figure 4D:
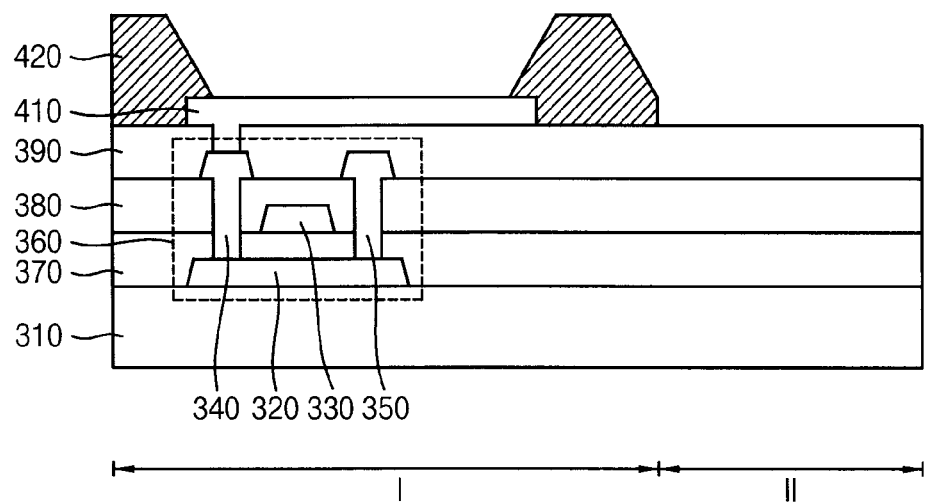

Referring to FIG. 4D, a first electrode 410 may be formed on the second insulating layer 390. The first electrode 410 may contact the source electrode 340 via the third contact hole. The first electrode 410 may be formed using metal, alloy, metal nitride, conductive metal oxide, transparent conductive materials, etc.

A pixel defining layer 420 may be formed on a portion of the second insulating layer 390 and a portion of the first electrode 410. The pixel defining layer 420 may cover both side portions of the first electrode 410, and may expose a portion of the first electrode 410. The pixel defining layer 420 may be formed using organic materials or inorganic materials.

Figure 4E:
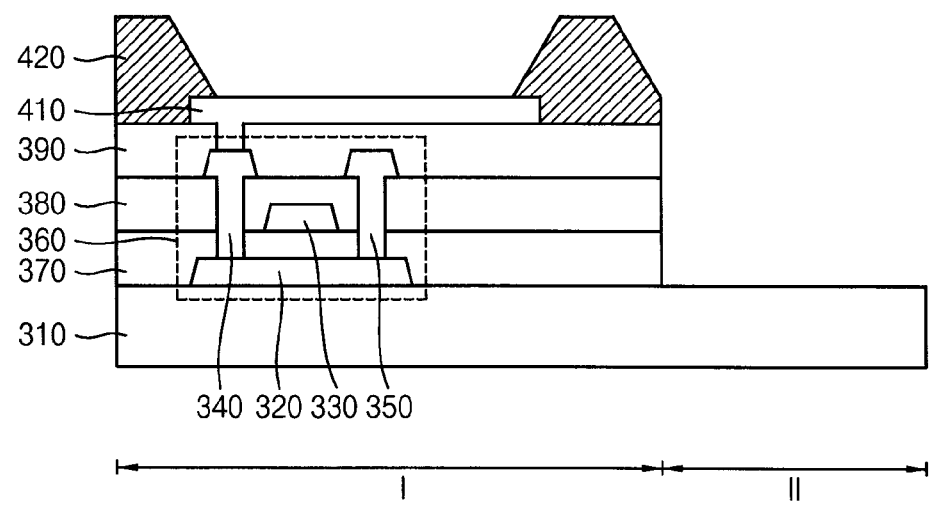

Referring to FIG. 4E, portions of the first insulating layer 370, the gate insulating layer 380, and the second insulating layer 390 positioned in the transparent region II of the first substrate 310 may be removed. That is, the insulating layers are not present in the transparent region II.

Figure 4F:
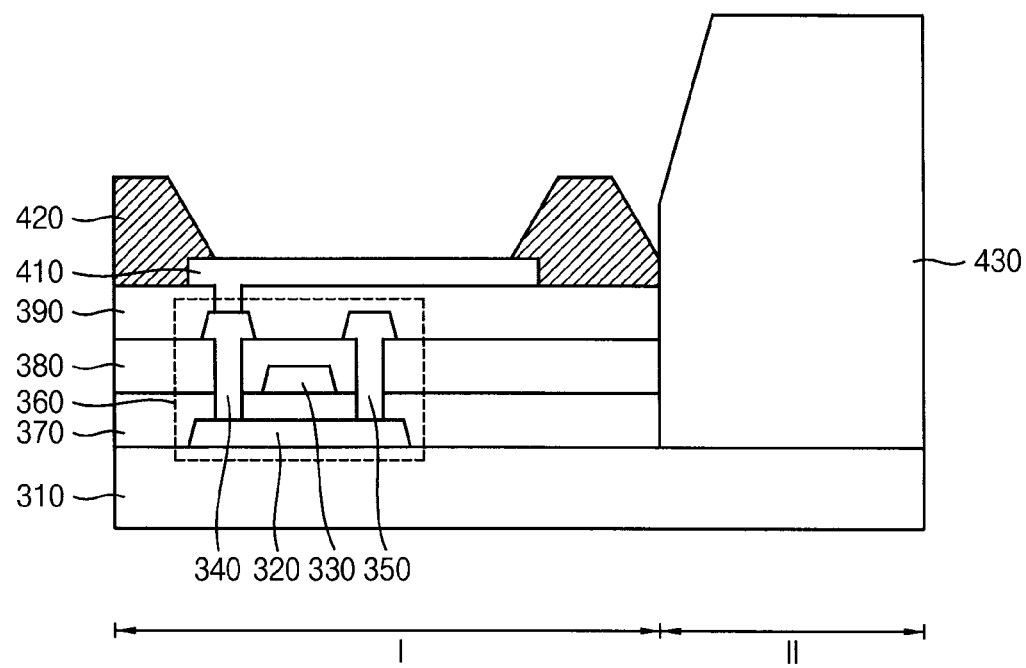

Referring to FIG. 4F, a light transmitting member 430 may be formed in the transparent region II of the first substrate 310. A lower surface of the light transmitting member 430 may contact the first substrate 310. The light transmitting member 430 may include transparent materials. For example, the light transmitting member 430 may be formed using polyimide, photoresist, acryl, polyamide, siloxane, etc. These may be used alone or in a combination thereof. In exemplary embodiments, the light transmitting member 430 may be formed using transparent siloxane, transparent acryl, and transparent polyimide. The refractive index of the light transmitting member 430 may be about 1.5. Alternately, the light transmitting member 430 may include a transparent member having transparent materials that have a refractive index in a range of between about 1.4 and about 1.6.

Figure 4G:
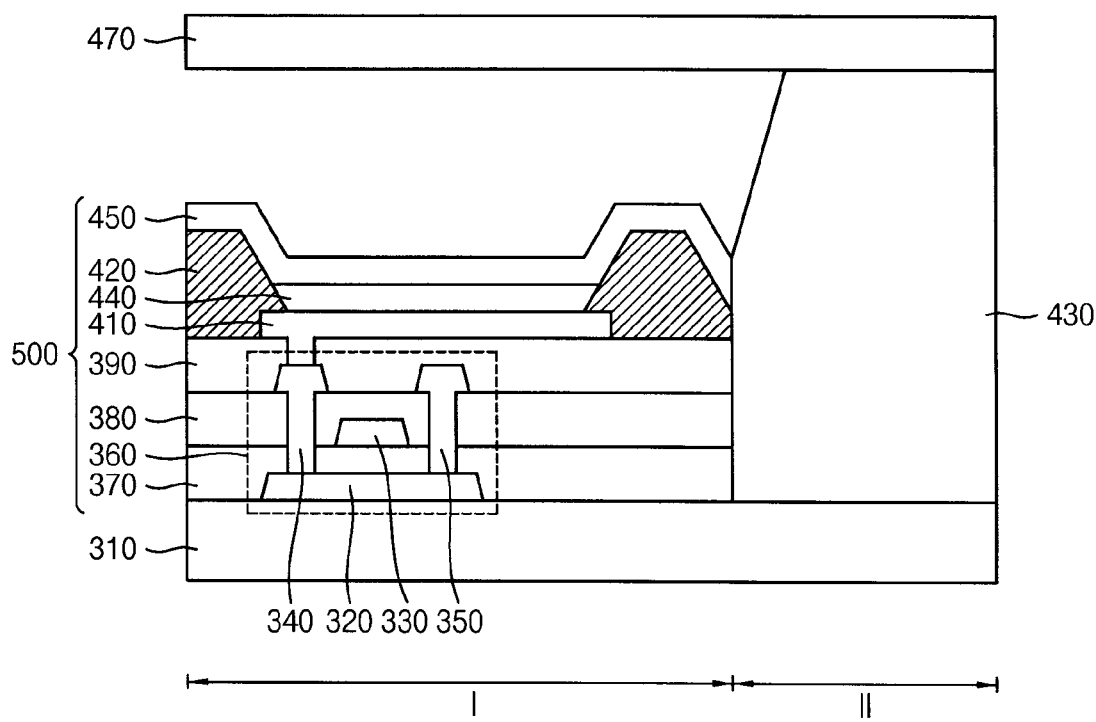

Referring to FIG. 4G, an emission layer 440 may be formed on the first electrode 410. The emission layer 440 may be formed using light emitting materials capable of generating different colors of light (e.g., a red color of light, a blue color of light, and a green color of light). The emission layer 440 may generally generate a white color of light by stacking light emitting materials capable of generating different colors of light. The second electrode 450 may be formed on the pixel defining layer 420 and the emission layer 440. The second electrode 450 may cover the pixel defining layer 420 and the emission layer 440, may be entirely formed in the pixel region I. That is, the second electrode 450 may not be formed in the transparent region II. The second electrode 450 may be formed using metal, alloy, metal nitride, conductive metal oxide, transparent conductive materials, etc. Thus, the emission structure 500 including the first insulating layer 370, the driving transistor 360, the gate insulating layer 380, the second insulating layer 390, the first electrode 410, the pixel defining layer 420, the emission layer 440, and the second electrode 450 may be formed.

The second substrate 470 may be formed on the light emitting structure 500 and the light transmitting member 430. The second substrate 470 may contact an upper surface of the light transmitting member 430. The second substrate 470 may include materials substantially the same as that of the first substrate 310. For example, the second substrate 470 may include a glass substrate, a quartz substrate, a synthetic quartz substrate, a calcium fluoride ($CaF_2$) substrate, a fluoride-doping quartz substrate, a sodalime substrate, a non-alkali substrate etc. In exemplary embodiments, the second substrate 470 may include the non-alkali substrate, and the refractive index of the second substrate 470 may be about 1.5. The second substrate 470 may include transparent materials that have a refractive index in a range of between about 1.4 and about 1.6. That is, the refractive index of the first substrate 310 and the light transmitting member 430 may be substantially the same as that of the second substrate 470. A light may be transmitted via the first substrate 310, the light transmitting member 430, and the second substrate 470 in the transparent region II. In other words, the light transmitting member 430 may include a lower surface that contacts the first substrate 310 and an upper surface that contacts the second substrate 470. Since the first substrate 310 and the light transmitting member 430 have substantially the same refractive index, the light transmitted through the first substrate 310 from the outside may not be refracted in the lower surface. That is, the light may not be refracted in an interface between the light transmitting member 430 and the first substrate 110. Since the light transmitting member 430 and the second substrate 470 have substantially the same refractive index, the light transmitted through the lower surface may not be refracted in the upper surface. That is, the light may not be refracted in an interface between the light transmitting member 430 and the second substrate 470. As a result, the light may transmit through the transparent region II of an organic light emitting display device without refraction of the light. In addition, since insulating layers (e.g., the first insulating layer 370, the gate insulating layer 380, and the second insulating layer 390) and the second electrode 450 that extend from the pixel region I are not formed in the transparent region II, interlayer interfaces capable of reflecting light may be reduced.

FIG. 5 is a cross-sectional view illustrating an organic light emitting display device in accordance with exemplary embodiments of the present invention. An organic light emitting display device 500 illustrated in FIG. 5 may have a configuration substantially the same as or similar to that of the organic light emitting display device 100 described with reference to FIG. 3, except for a black matrix 680 and a color filter 690. In FIG. 5, detailed descriptions for elements that are substantially the same as or similar to the elements described with reference to FIG. 3 will be omitted.

Referring to FIG. 5, an organic light emitting display device 500 may include a first substrate 510, a light emitting structure 600, a light transmitting member 630, a second substrate 670, a black matrix 680, a color filter 690, etc. Here, the light emitting structure 600 may include a driving transistor 560, a first insulating layer 570, a gate insulating layer 580, a second insulating layer 590, a first electrode 610, a pixel defining layer 620, an emission layer 640, a second electrode 650, etc. The driving transistor 560 may include an active layer 520, a gate electrode 530, a source electrode 540, and a drain electrode 550. In exemplary embodiments, the organic light emitting display device 500 may include a pixel region I and a transparent region II. The light emitting structure 600 may be positioned in the pixel region I. The light transmitting member 630 may be positioned in the transparent region II. A display image may be displayed in the pixel region I. An image of an object that is located behind the organic light emitting display device 500 may be transmitted through the transparent region II. Accordingly, the organic light emitting display device 500 may serve as a transparent display device including the transparent region II.

The black matrix 680 and the color filter 690 may be disposed on a lower surface of the second substrate 670. The black matrix 680 may be positioned to overlap the pixel defining layer 620. The color filter 690 may be positioned to overlap the emission layer 640. The black matrix 680 may include black materials such as carbon black, phenylene black, aniline black, cyanine black, nigrosine acid black, and/or black resin, etc. In addition, the color filter 690 may have a color substantially the same as a color of a light generated in the emission layer 640. Because the light generated by the emission layer 640 transmits to the color filter 690 having a high transmission characteristic, color saturation of the light may be increased. The black matrix 680 may serve as a light blocking layer, and may reduce light reflection. Accordingly, as the organic light emitting display device 500 including the black matrix 680 and the color filter 690 may reduce light reflection and increase color saturation, definition of an image of an object that is located behind the organic light emitting display device 500 may be increased.

Figure 6:
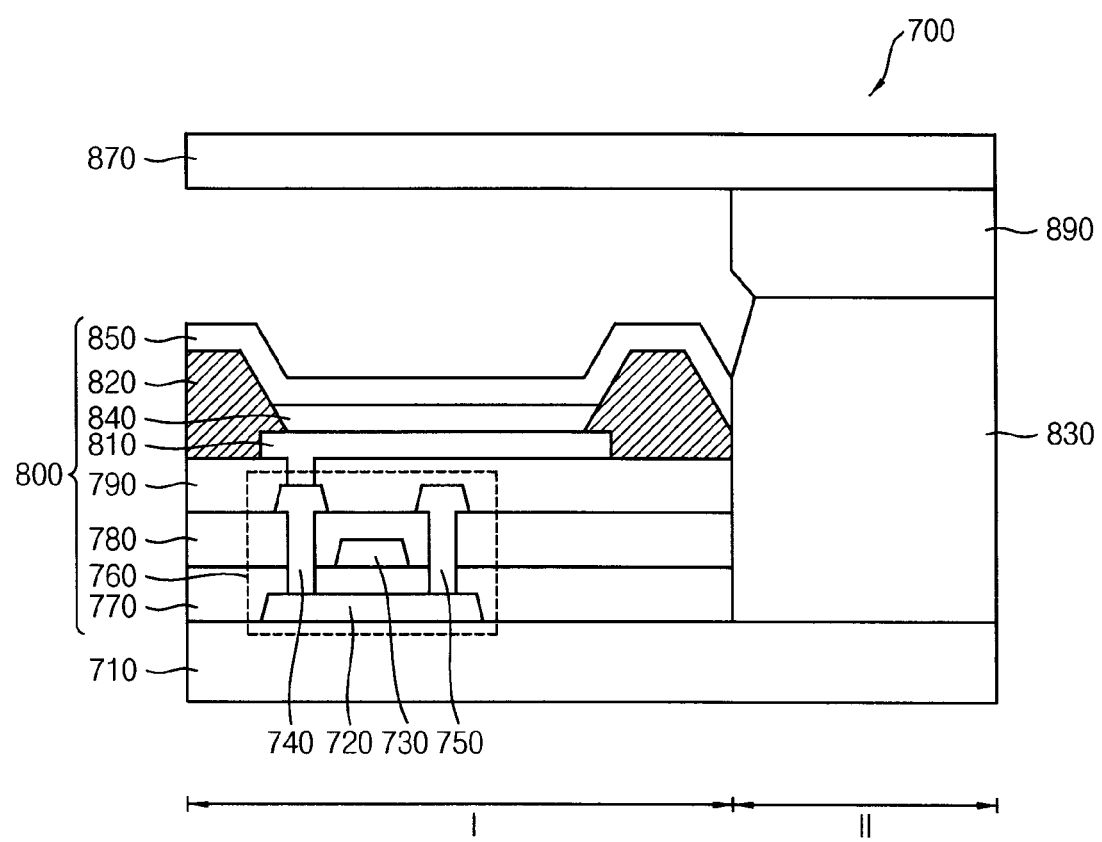
FIG. 6 is a cross-sectional view illustrating an organic light emitting display device in accordance with exemplary embodiments of the present invention.

FIG. 6 is a cross-sectional view illustrating an organic light emitting display device in accordance with exemplary embodiments of the present invention. An organic light emitting display device 700, illustrated in FIG. 6, may have a configuration substantially the same as or similar to that of the organic light emitting display device 100 described with reference to FIG. 3, except a first light transmitting layer 830 and a second light transmitting layer 890. In FIG. 6, detailed descriptions for elements that are substantially the same as or similar to the elements described with reference to FIG. 3, will be omitted.

Referring to FIG. 6, an organic light emitting display device 600 may include a first substrate 710, a light emitting structure 800, a first light transmitting layer 830, a second light transmitting layer 890, a second substrate 870, etc. Here, the light emitting structure 800 may include a driving transistor 760, a first insulating layer 770, a gate insulating layer 780, a second insulating layer 790, a first electrode 810, a pixel defining layer 820, an emission layer 840, a second electrode 850, etc. The driving transistor 760 may include an active layer 720, a gate electrode 730, a source electrode 740, and a drain electrode 750. In exemplary embodiments, the organic light emitting display device 700 may include a pixel region I and a transparent region II. The light emitting structure 800 may be positioned in the pixel region I. The first light transmitting layer 830 and the second light transmitting layer 890 may be positioned in the transparent region II. For example, a display image may be displayed in the pixel region I. An image of an object that is located behind the organic light emitting display device 700 may be transmitted in the transparent region II. Accordingly, the organic light emitting display device 700 may serve as a transparent display device including the transparent region II.

The first light transmitting layer 830 may be disposed in the transparent region II of the first substrate 710. The first light transmitting layer 830 may contact the first substrate 710. The second light transmitting layer 890 may be disposed on the first light transmitting layer 830. The second light transmitting layer 890 may contact the second substrate 870. The first light transmitting layer 830 and the second light transmitting layer 890 may include the same material. For example, each of the first light transmitting layer 830 and the second light transmitting layer 890 may include polyimide, photoresist, acryl, polyamide, siloxane, etc. These may be used alone or in a combination thereof. In exemplary embodiments, each of the first and second light transmitting layers 830 and 890 may include transparent siloxane, transparent acryl, and transparent polyimide. When the first light transmitting layer 830 and the second light transmitting layer 890 include the same material, the first and second light transmitting layers 830 and 890 may be integrally formed. A refractive index of the first and second light transmitting layers 830 and 890 may be about 1.5. The first and second light transmitting layers 830 and 890 may include a transparent member including transparent materials having a refractive index in a range of between about 1.4 and about 1.6. Since the first light transmitting layer 830 and the second light transmitting layer 890 have the same refractive index, a light may not be refracted in an interface between the first light transmitting layer 830 and the second light transmitting layer 890. That is, light may transmit through the transparent region II of the organic light emitting display device 700 without refraction because the first substrate 710, the first light transmitting layer 830, the second gate electrode 890, and second substrate 870 have substantially the same refractive index. Since the insulating layers and the second electrode 850 extending from the pixel region I are not disposed in the transparent region II, interlayer interfaces capable of reflecting light may be reduced. Accordingly, definition of an image of an object that is located behind the organic light emitting display device 700 may be increased.

Figure 7:
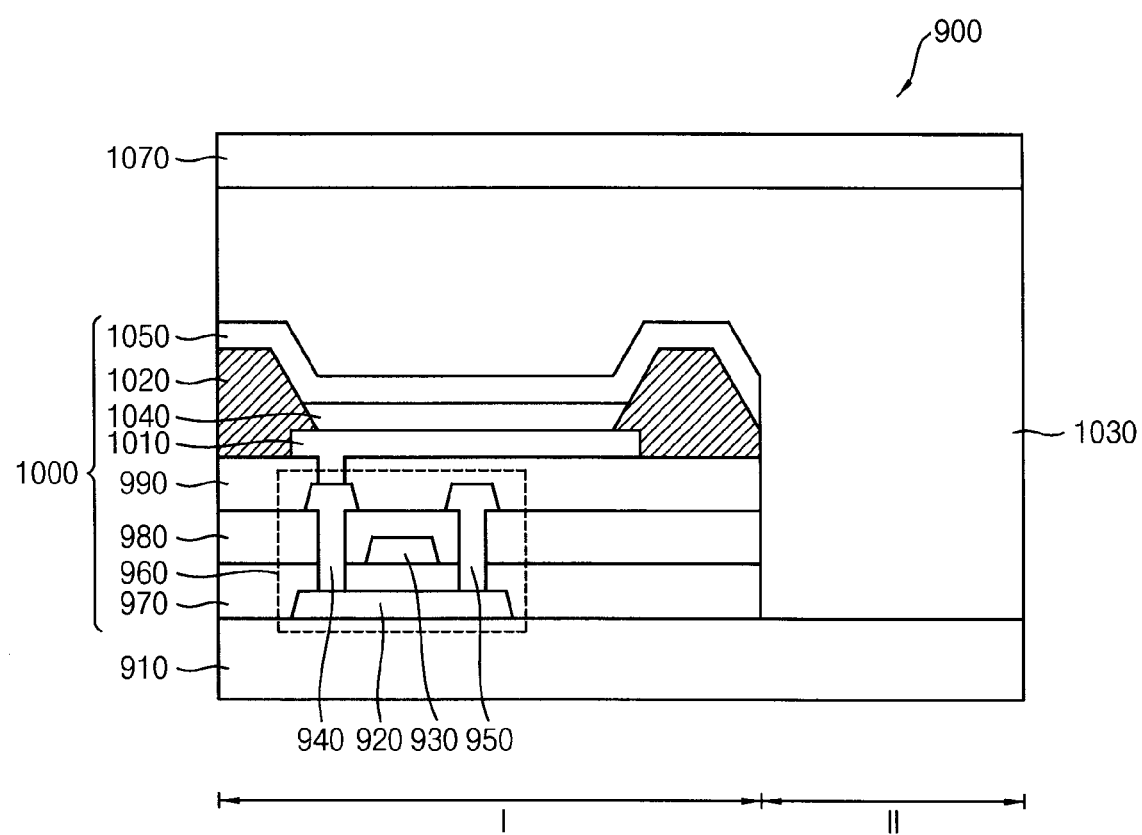
FIG. 7 is a cross-sectional view illustrating an organic light emitting display device in accordance with exemplary embodiments of the present invention.

FIG. 7 is a cross-sectional view illustrating an organic light emitting display device in accordance with exemplary embodiments of the present invention. An organic light emitting display device 900 illustrated in FIG. 7 may have a configuration substantially the same as or similar to that of the organic light emitting display device 100 described with reference to FIG. 3, except a transparent member 1030. In FIG. 7, detailed descriptions for elements that are substantially the same as or similar to the elements described with reference to FIG. 3, will be omitted.

Referring to FIG. 7, an organic light emitting display device 900 may include a first substrate 910, a light emitting structure 1000, a second substrate 1070, a transparent member 1030 etc. Here, the light emitting structure 1000 may include a driving transistor 960, a first insulating layer 970, a gate insulating layer 980, a second insulating layer 990, a first electrode 1010, a pixel defining layer 1020, an emission layer 1040, a second electrode 1050, etc. The driving transistor 960 may include an active layer 920, a gate electrode 930, a source electrode 940, and a drain electrode 950. In exemplary embodiments, the organic light emitting display device 900 may include a pixel region I and a transparent region II. The light emitting structure 1000 may be positioned in the pixel region I. In addition, the transparent member 1030 may be positioned in the pixel region I and the transparent region II. A display image may be displayed in the pixel region I. An image of an object that is located behind the organic light emitting display device 900 may be transmitted through the transparent region II. Accordingly, the organic light emitting display device 900 may serve as a transparent display device including the transparent region II.

The transparent member 1030 may be disposed in the pixel region I and the transparent region II of the first substrate 910. In particular, in the pixel region I, the transparent member 1030 may interposed between the emission structure 1000 and the second substrate 1070. In the transparent region II, the transparent member 1030 may be interposed between the first substrate 910 and the second substrate 1070. The transparent member 1030 may contact an upper surface of the emission structure 1000 and a lower surface of the second substrate 1070 in the pixel region I. The transparent member 1030 may contact an upper surface of the first substrate 910 and a lower surface of the second substrate 1070 in the transparent region II. The transparent member 1030 may include transparent organic materials that have low viscosity. For example, the transparent member 1030 may include polyimide, photoresist, acryl, polyamide, siloxane, etc. These may be used alone or in a combination thereof.

The transparent member 1030 may fill the pixel region I and the transparent region II after the emission structure 1000 is disposed on the first substrate 910. After the transparent member 1030 is disposed in the pixel region I and the transparent region II, the second substrate 1070 may be disposed. After the second substrate 1070 is disposed, a curing process may be performed. That is, the transparent member 1030 may be integrally formed in the pixel region I and the transparent region II.

The refractive index of the transparent member 1030 may be about 1.5. The transparent member 1030 may include a transparent member including transparent materials having a refractive index in a range of between about 1.4 and about 1.6. Since the first substrate 910, the transparent member 1030, and the second substrate 1070 have substantially the same refractive index, in the transparent region II, light may not be refracted in interfaces between the first substrate 910 and the transparent member 1030 and between the transparent member 1030 and the second substrate 1070. Definition of an image of an object that is located behind the organic light emitting display device 900 may therefore be increased. Since the transparent member 1030 is disposed in the pixel region I of the first substrate 910, the transparent member 1030 may protect the light emitting structure 1000 from the moisture penetration and external impact.

Figure 8:
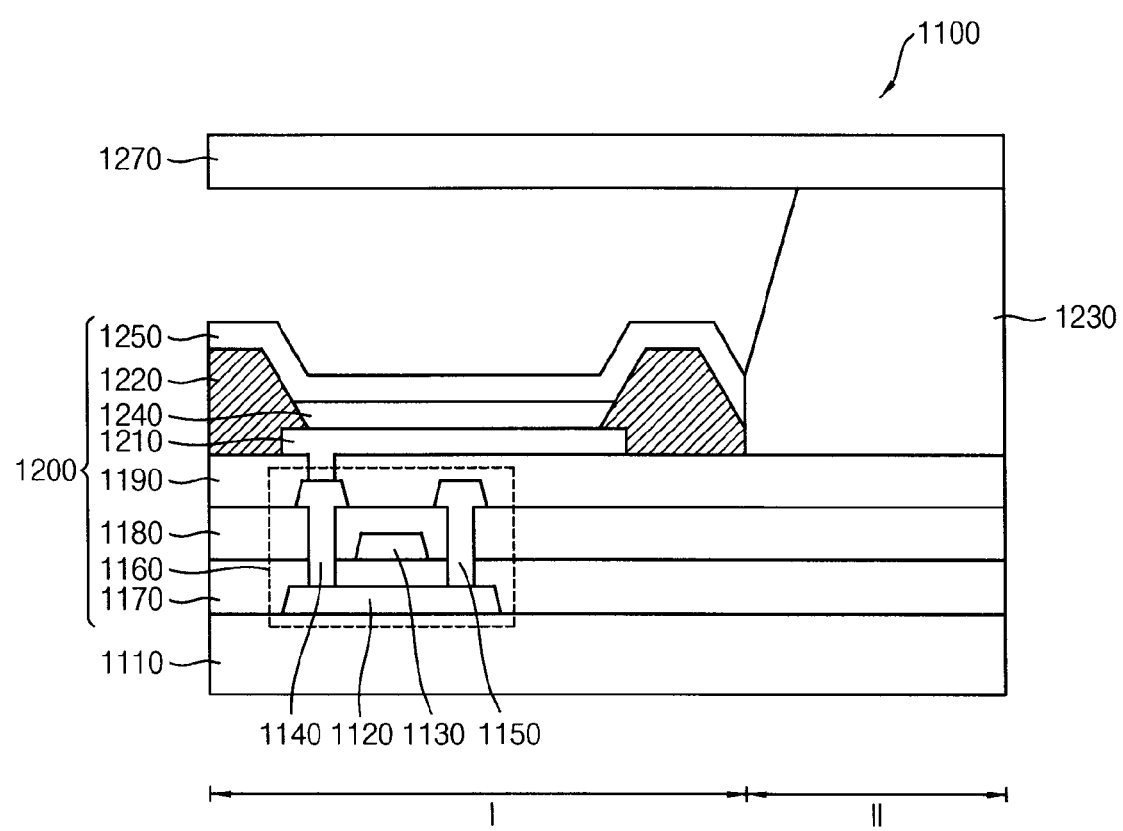
FIG. 8 is a cross-sectional view illustrating an organic light emitting display device in accordance with exemplary embodiments of the present invention.

FIG. 8 is a cross-sectional view illustrating an organic light emitting display device in accordance with exemplary embodiments. An organic light emitting display device 1100 illustrated in FIG. 8 may have a configuration substantially the same as or similar to that of the organic light emitting display device 100 described with reference to FIG. 3 except insulating layers disposed in the transparent region II. In FIG. 8, detailed descriptions for elements, which are substantially the same as or similar to the elements described with reference to FIG. 3, will be omitted.

Referring to FIG. 8, an organic light emitting display device 1100 may include a first substrate 1110, a light emitting structure 1200, a second substrate 1270, a transparent member 1230, etc. Here, the light emitting structure 1200 may include a driving transistor 1160, a first insulating layer 1170, a gate insulating layer 1180, a second insulating layer 1190, a first electrode 1210, a pixel defining layer 1220, an emission layer 1240, a second electrode 1250, etc. The driving transistor 1160 may include an active layer 1120, a gate electrode 1130, a source electrode 1140, and a drain electrode 1150. In exemplary embodiments, the organic light emitting display device 1100 may include a pixel region I and a transparent region II. The light emitting structure 1200 may be positioned in the pixel region I. The transparent member 1230 may be positioned in the transparent region II. A display image may be displayed in the pixel region I. An image of an object that is located behind the organic light emitting display device 1100 may be transmitted through the transparent region II. Accordingly, the organic light emitting display device 1100 may serve as a transparent display device including the transparent region II.

The first insulating layer 1170 may be disposed on the first substrate 1110. The first insulating layer 1170 may cover the active layer 1120, and may extend from the pixel region I into the transparent region II. That is, the first insulating layer 1170 may be entirely disposed in the pixel region I and the transparent region II of the first substrate 1110. The gate insulating layer 1180 may be disposed on the first insulating layer 1170. The gate insulating layer 1180 may cover the gate electrode 1130, and may extend from the pixel region I into the transparent region II. That is, the gate insulating layer 1180 may be entirely disposed in the pixel region I and the transparent region II of the first substrate 1110. The second insulating layer 1190 may be disposed on the gate insulating layer 1180. The second insulating layer 1190 may cover the source electrode 1140 and the drain electrode 1150, and may extend from the pixel region I into the transparent region II. That is, the second insulating layer 1190 may be entirely disposed in the pixel region I and the transparent region II of the first substrate 1110. Each of the first insulating layer 1170, the gate insulating layer 1180, and second insulating layer 1190 may include inorganic materials or organic materials. For example, the inorganic materials may include silicon oxide (SiOx), silicon nitride (SiNx), silicon oxynitride (SiOxNy), Aluminum oxide (AlOx), aluminum nitride (AlNx), titanium oxide (TiOx), zinc oxide (ZnOx), etc. The organic materials may include acrylate monomer, phenylacetylene, diamine, dianhydride, siloxane, silane, parylene, polyethylene, polypropylene, polyethylene terephthalate (PET), fluororesin, polysiloxane, etc. In exemplary embodiments, the first insulating layer 1170, the gate insulating layer 1180, and the second insulating layer 1190 may have substantially the same material, and may have substantially the same refractive index.

The light transmitting member 1230 may be disposed on the second insulating layer 1190 in the transparent region II.

A lower surface of the light transmitting member 1230 may contact the second insulating layer 1190. For example, light transmitting member 1230 may include polyimide, photoresist, acryl, polyamide, siloxane, etc. These may be used alone or in a combination thereof. In exemplary embodiments, the transparent member 1230 may include transparent siloxane, transparent acryl, and/or transparent polyimide. The refractive index of the light transmitting member 1230 may be about 1.5. The light transmitting member 1230 may include a transparent member including transparent materials having a refractive index in a range of about 1.4 and about 1.6. Since the light transmitting member 230 and the insulating layers (e.g., the first insulating layer 1170, the gate insulating layer 1180, and the second insulating layer 1190) have substantially the same refractive index, light may not be refracted in interlayer interfaces. That is, the light may transmit through the transparent region II of the organic light emitting display device 1100 without refraction because the light transmitting member 1230 and the insulating layers may have substantially the same refractive index. Accordingly, definition of an image of an object that is located behind the organic light emitting display device 1100 may be increased.

The example embodiments of the invention may be applied to various display devices including an organic light emitting display device. For example, the example embodiments of the invention may be employed in a vehicle-display device, a ship-display device, an aircraft-display device, portable communication devices, display devices for display or for information transfer, a medical-display device, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents u) but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An organic light emitting display device, comprising:
    a first substrate comprising a pixel region and a transparent region;
    a light emitting structure disposed in the pixel region of the first substrate;
    a light transmitting member disposed in the transparent region of the first substrate; and
    a second substrate disposed on the light emitting structure and the light transmitting member,
    wherein light is not refracted in interfaces between the light transmitting member and the first substrate and between the light transmitting member and the second substrate.

2. The organic light emitting display device of claim 1, wherein the light transmitting member contacts the first substrate and the second substrate.

3. The organic light emitting display device of claim 1, wherein the refractive indices of the first substrate, the light transmitting member, and the second substrate are the same.

4. The organic light emitting display device of claim 1, wherein the refractive indices of the first substrate, the light transmitting member, and the second substrate are in a range of 1.4 to 1.6.

5. The organic light emitting display device of claim 1, wherein the light transmitting member comprises at least one selected from polyimide, photoresist, acryl, polyamide, and siloxane.

6. The organic light emitting display device of claim 1, wherein the first substrate and the second substrate comprise non-alkali materials.

7. The organic light emitting display device of claim 1, wherein the light transmitting member comprises:
    a first light transmitting layer; and
    a second light transmitting layer,
    wherein the first light transmitting layer and the second light transmitting layer are interposed between the first substrate and the second substrate.

8. The organic light emitting display device of claim 7, wherein the first light transmitting layer and the second light transmitting layer comprise the same material.

9. The organic light emitting display device of claim 7, wherein the first light transmitting layer and the second light transmitting layer are integrally formed.

10. The organic light emitting display device of claim 7, wherein the second light transmitting layer is disposed on the first light transmitting layer.

11. The organic light emitting display device of claim 10, wherein a light is not refracted in an interface between the first light transmitting layer and the second light transmitting layer.

12. The organic light emitting display device of claim 7, wherein the refractive indices of the first substrate, the first light transmitting layer, the second light transmitting layer, and the second substrate are the same.

13. The organic light emitting display device of claim 1, wherein the light emitting structure comprises:
    semiconductor elements;
    a plurality of insulating layers;
    a pixel defining layer;
    a first electrode;
    an emission layer;
    and a second electrode.

14. The organic light emitting display device of claim 13, wherein the light transmitting member comprises at least one insulating layer disposed in the transparent region.

15. The organic light emitting display device of claim 14, wherein the at least one insulating layer has the same refractive index as the light transmitting member.

16. The organic light emitting display device of claim 13, further comprising a color filter and a black matrix disposed on a lower surface of the second substrate.

17. The organic light emitting display device of claim 16, wherein the color filter overlaps the emission layer, and wherein the black matrix overlaps the pixel defining layer.

18. The organic light emitting display device of claim 1, further comprising a transparent member interposed between the light emitting structure and the second substrate in the pixel region.

19. The organic light emitting display device of claim 18, wherein the transparent member and the light transmitting member comprise the same material.

20. The organic light emitting display device of claim 19, wherein the transparent member and the light transmitting member are integrally formed.

* * * * *

UNITED STATES PATENT AND TRADEMARK OFFICE
CERTIFICATE OF CORRECTION

PATENT NO. : 9,564,611 B2  
APPLICATION NO. : 14/662875  
DATED : February 7, 2017  
INVENTOR(S) : Jung-Woo Moon et al.

It is certified that error appears in the above-identified patent and that said Letters Patent is hereby corrected as shown below:

On the Title Page

Item [30], insert:  
--September 1, 2014 (KR) ------ 10-2014-0115101--.

Signed and Sealed this  
Tenth Day of September, 2019

Andrei Iancu  
*Director of the United States Patent and Trademark Office*